United States Patent [19]

Shizukuishi et al.

[11] Patent Number: 5,075,575

[45] Date of Patent: Dec. 24, 1991

[54] EXTERNALLY SYNCHRONIZED PROGRAMMABLE DEVICE

[75] Inventors: Makoto Shizukuishi; Kazuo Kawamura, both of Kanagawa, Japan

[73] Assignee: Fuji Photo Film Co., Ltd., Kanagawa, Japan

[21] Appl. No.: 622,578

[22] Filed: Dec. 5, 1990

[30] Foreign Application Priority Data

Dec. 11, 1989 [JP] Japan .................................. 1-318960
Dec. 11, 1989 [JP] Japan .................................. 1-318961

[51] Int. Cl.$^5$ ........................................ H03K 19/177
[52] U.S. Cl. .................................. 307/465; 307/480; 307/511; 331/1 A
[58] Field of Search ................ 307/465, 480, 510-511, 307/517, 527, 528, 269; 340/825.71, 825.87; 331/1 A, 17, 25

[56] References Cited

U.S. PATENT DOCUMENTS

| | | | |
|---|---|---|---|
| 4,775,890 | 10/1988 | Balaban et al. | 307/510 X |
| 4,808,937 | 2/1989 | Correa et al. | 307/511 X |
| 4,857,860 | 8/1989 | Tateishi | 331/25 X |
| 4,943,786 | 7/1990 | Cordwell et al. | 331/1 A |
| 4,975,930 | 12/1980 | Shaw | 331/25 X |
| 5,015,871 | 5/1991 | Sirabella | 307/465 X |
| 5,023,484 | 6/1991 | Pathak et al. | 307/465 |

OTHER PUBLICATIONS

Collins, "Digital Phase-Lock Oscillator", *IBM T.D.B.*, vol. 16, No. 8, Jan. 1974.

*Primary Examiner*—David Hudspeth
*Attorney, Agent, or Firm*—Sughrue, Mion, Zinn, Macpeak & Seas

[57] ABSTRACT

In a programmable device wherein a circuit can be designed by programming the device according to a certain design specification, and the circuit is phase or frequency synchronized to an externally supplied signal. The device further allows for redesign by reprogramming the device.

10 Claims, 10 Drawing Sheets

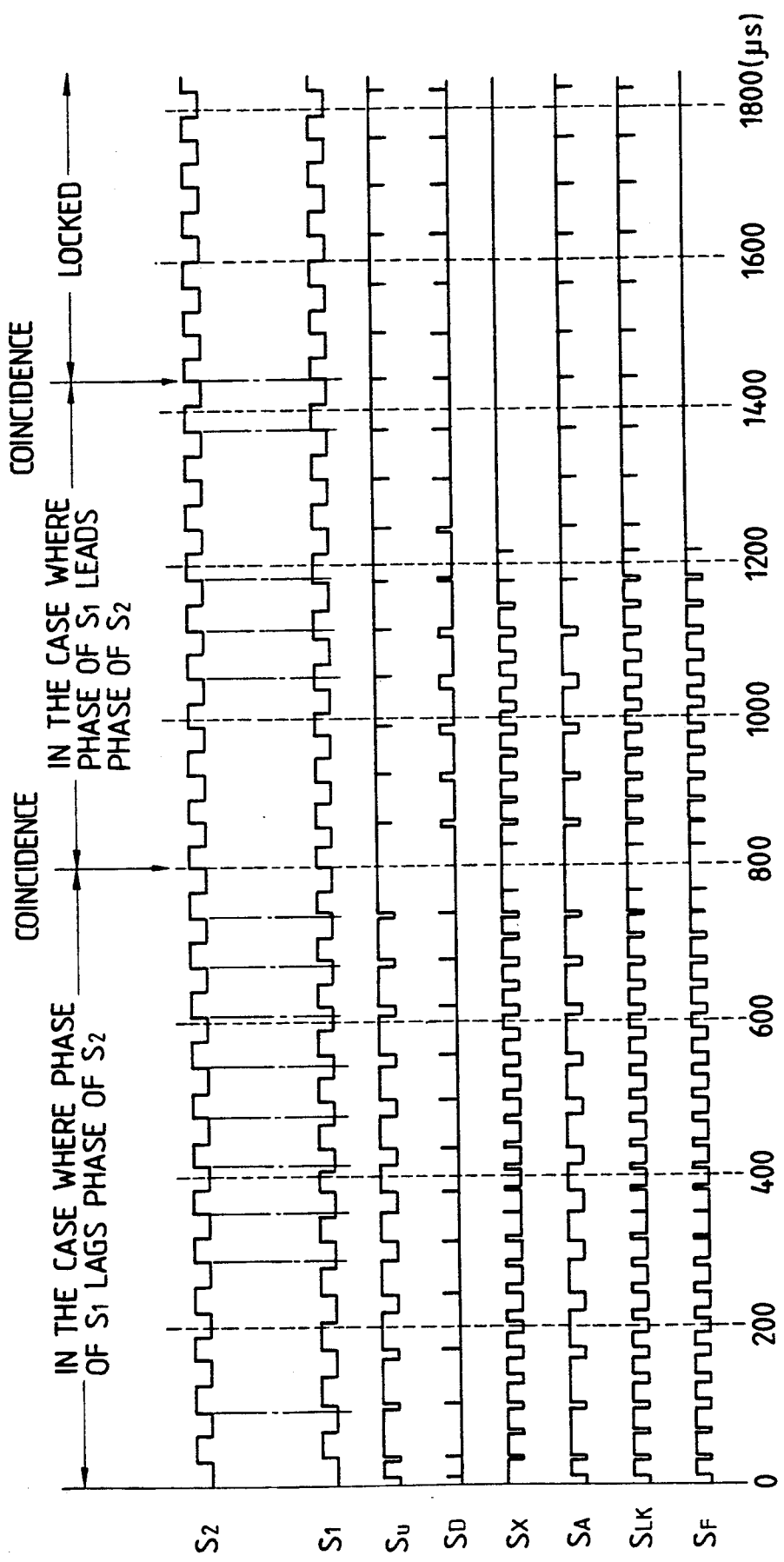

EXTERNALLY SYNCHRONIZED PROGRAMMABLE DEVICE

BACKGROUND OF THE INVENTION

The present invention relates to an externally synchronized programmable device in which a desired circuit can be easily programmed and/or reprogrammed by a circuit designer, and an internal circuit of the device is made to operate in synchronism with the phase or frequency of an external signal.

Programmable logic devices which can be easily programmed or reprogrammed by a circuit designer to correspond to a desired circuit specification are well known. Such programmable logic devices, which are composed of matrices of AND and OR gates, can be programmed to realize a logic circuit having a two-stage AND-OR structure. Further, the circuit can be changed or reconstructed by reprogramming the device. Accordingly, the device has many general purpose usages.

The programmable logic device can not only realize a random logic circuit, but also it can realize a sequential circuit by feeding the output of an AND matrix or the output of an internal flip-flop circuit back to the input side of the AND matrix. Accordingly, the device is suitable for use in controllers such as sequential controllers or various kinds of instrumentation apparatuses.

In general, conventional programmable logic devices have a configuration as shown in FIG. 8. As shown in FIG. 8, an AND matrix 1 having input signal lines $L_1-L_m$ (represented by a group of vertical lines) and term lines $l_1-l_n$ (represented by a group of horizontal lines) arranged to intersect the input signal lines are provided. They permit a desired logic circuit to be constructed by programming lattice points formed at the intersections. The device further contains an OR matrix (functionally represented by multiple-input OR gates $OR_1-OR_i$ in the drawing) conjugated through the AND output (functionally represented by AND gates) produced on the AND term lines $l_1-l_n$. Further, general input ports $I_1-I_j$ are provided for supplying logic signals from the outside to a part of the input signal lines $L_1-L_m$, a clock input terminal CLK for receiving a clock signal supplied thereto, output ports for feeding the output signals of the OR matrix (multiple-input OR gates $OR_1-OR_i$ in the drawing) to the outside, and a control signal input terminal CNT for supplying a control signal to control the output timing of the output ports.

The output circuit relating to an output terminal $P_1$ in the output ports will be described. A certain OR output (e.g., $OR_1$) is connected to a data-input D of a D-type flip-flop circuit $FF_1$. An output Q of the flip-flop circuit is connected to an output terminal $P_1$ through an output buffer circuit $B_1$. The clock input of the flip-flop circuit $FF_1$ receives the clock signal from the clock-input terminal through an input buffer circuit. The output buffer circuit $B_1$ is responsive to the logical level of the control signal supplied from the control signal input terminal CNT, so that the output signal of the flip-flop circuit $FF_1$ is transmitted to the output terminal $P_1$ or is turned to a high-impedance state. The flip-flop circuit $FF_1$ is arranged so that the inverted output Q is fed back to a part of the input signal lines $L_1-L_m$ through a buffer circuit $FB_1$. The output circuit relating to the other output terminals $P_2-P_i$ has the same construction as just described, and each output terminal is also referred to as a cell structure.

Complex sequential controllers and various kinds of signal processing circuits can be designed by programming certain lattice points of the AND matrix to form a shift-register or a counter from the flip-flop circuits and by feeding the output thereof back to the AND matrix.

Phase or frequency synchronization is an effective technique used in sequential controllers and signal processing circuits which are often used to control various kinds of electronic appliances. This method of phase or frequency synchronization, synchronizes the circuits to a phase or frequency of a known external signal.

According to this technique, in the case where a plurality of systems, operating in synchronism with different frequencies are made to operate in synchronism with each other, one of the systems can be made to operate in synchronism with the other system by making the one system follow the phase or frequency of a signal transferred from the other system. art. The PLL technique has been used in motor speed control systems, FM/AM transmission and reception systems, instrumentation systems for picking out a target signal from noise, and the like. A PLL device, has been developed in the form of an IC (integrated circuit).

However, conventional PLL device have always been developed as an exclusive-use device, that is, designed for a specific purpose. Accordingly, a special PLL device must be selected corresponding to the purpose. For system reconstruction, the PLL device must be replaced by another PLL device. Further, a PLL device suitable for a certain system may not be available. In short, this limits the degree of freedom in system design.

SUMMARY OF THE INVENTION

The present invention discloses a device which overcomes the aforementioned problems. That is, an object of the present invention is to provide a general-purpose external synchronization programmable device in which external synchronization can be performed. In addition, a circuit designer can easily design or redesign a circuit corresponding to a specific circuit specification.

According to the present invention, the foregoing objects are achieved by a programmable device in the form of an IC comprising: a programmable logic portion having AND and OR matrices to realize a logic circuit by programming connecting comprising: a programmable logic portion having AND and OR matrices to realize a logic circuit by programming connecting lattice points of the matrices; and a phase comparison circuit for comparing an external signal with an internal signal generated in the logic circuit to thereby produce an output signal expressing phase lagging or phase leading and for transferring the output signal to a predetermined part of signal input lines of the AND matrix.

According to another aspect of the invention, a programmable device is provided in the form of an IC which comprises: a programmable logic portion having AND and OR matrices to construct a desired logic circuit by programming specific lattice points to connect; and a phase comparison circuit for comparing the phase of an external signal with the phase of an internal signal generated in the programmably formed logic circuit, to generate a signal expressing the phase difference between the two signals, to generate a signal expressing whether the phases of the two signals coincide with each other, and for feeding the signal to a predetermined part of input signal lines of the AND matrix.

In the programmable device according to the present invention, a signal expressing phase lagging or phase leading between an externally supplied signal and an internal signal, generated in the internal programmable logic, can be generated by supplying the external and internal signals into the phase comparison circuit. Accordingly, an external synchronization system suitable for feeding the phase-lagging/leading signal back to the internal circuit to make the signal reach to a predetermined value can be realized easily by a small number of parts. Further, any suitable circuit can be realized in the programmable logic portion by programming suitable lattice points. Accordingly, the degree of freedom in circuit design can be made high and the design can be easily changed.

An external synchronization system such as a PLL circuit can be easily realized with a small number of parts by realizing a control circuit by the programmable logic portion for controlling various kinds of devices according to the signal expressing whether the phases of the two signals coincide with each other.

Further, a desired circuit can be formed in the programmable logic portion by programming suitable lattice points. Accordingly, there is a high degree of freedom in circuit design and the design can be easily changed.

BRIEF DESCRIPTION OF THE DRAWINGS

FIG. 12 is a timing chart for explaining the operation of the PLL circuit depicted in FIG. 11.

Preferred embodiments of the present invention will be described with reference to the accompany drawings.

DESCRIPTION OF THE PREFERRED EMBODIMENTS

Figure 1:
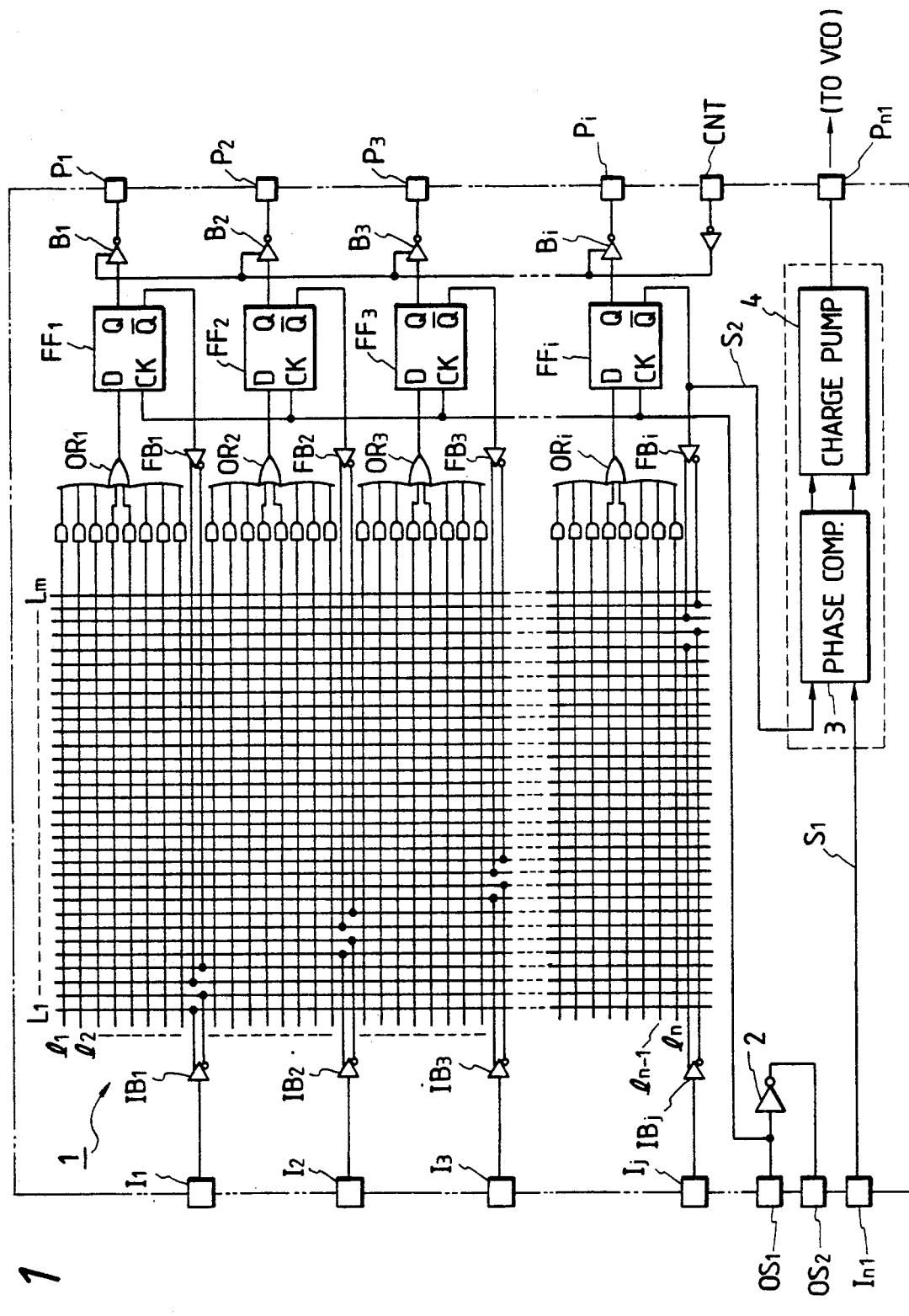
FIG. 1 is an explanatory diagram showing an example of the configuration of an embodiment of the present invention.

With reference to FIG. 1, an example of the construction of the present invention is shown. In this embodiment, the device is formed as an IC (integrated circuit) by a CMOS semiconductor process. The device has an AND matrix 1 having input signal lines $L_1-L_m$ (represented by a group of vertical lines) and AND term lines $l_1-l_n$ (represented by a group of horizontal lines) arranged to intersect the input signal lines. The AND matrix is for the purpose of attaining a desired logic circuit by suitably programming lattice points formed at the intersections. The device also has an OR matrix (functionally represented by multiple-input OR gates $OR_1-OR_i$) conjugated through the AND output (functionally represented by AND gates) produced in the AND term lines $l_1-l_n$. Further, general input ports $I_1-I_j$ are provided for supplying logic signals from the outside to a part of the input signal lines $L_1-L_m$, and a control signal input terminal CNT for supplying a control signal. Further, output ports having output terminals $P_1-P_i$ are provided for feeding the output signals of the OR matrix (multiple-input OR gates $OR_1-OR_i$) to the outside.

The output circuit related to an output terminal $P_1$ in the output ports will be described. A certain OR output (e.g., $OR_1$) is connected to a data-input contact D of a D-type flip-flop circuit $FF_1$. An output contact Q of the flip-flop circuit is connected to an output terminal $P_1$ through an output buffer circuit $B_1$. A clock-input contact of the flip-flop circuit $FF_1$ is arranged so as to receive the clock signal from the clock-input terminal through an input buffer circuit. The output buffer circuit $B_1$ operates in response to the logical level of the control signal supplied from the control signal input terminal CNT so that the output signal of the flip-flop circuit $FF_1$ is transmitted to the output terminal $P_1$ or is turned to a high-impedance state. Further, the flip-flop circuit $FF_1$ is arranged so that the inverted output Q thereof is fed back to a part of the input signal lines $L_1-L_m$ through a buffer circuit $FB_1$. The output circuit related to the other output terminals $P_2-P_i$ has the same construction as described above. In short, the output circuit has a cell structure.

Reference numeral 2 designates an oscillation buffer connected between input-output terminals $OS_1$ and $OS_2$. A reference clock signal may be generated in the form of internal oscillation by connecting a quartz resonator or an RC circuit to the outside or may be generated in the form of external oscillation by feeding an external clock signal directly from the terminal $OS_1$ to the clock-input terminals (CK) of the internal flip-flop circuits.

Reference numeral 3 designates a phase comparison circuit for comparing the phase of an external signal $S_1$ given through an input terminal $In_1$ with the phase of an internal signal $S_2$ given through the OR output $OR_i$ or the output terminal (i.e., inverted output terminal Q in this embodiment) of the flip-flop circuit $FF_i$. The phase comparison circuit 3 generates a signal expressing the phase difference between the two signals.

Reference numeral 4 designates a charge pump circuit in which a digital signal, subjected to pulse-width modulation corresponding to the signal generated from the phase comparison circuit (in this embodiment, the digital phase comparator) 3, is fed to an output terminal $Pn_1$.

Figure 2:
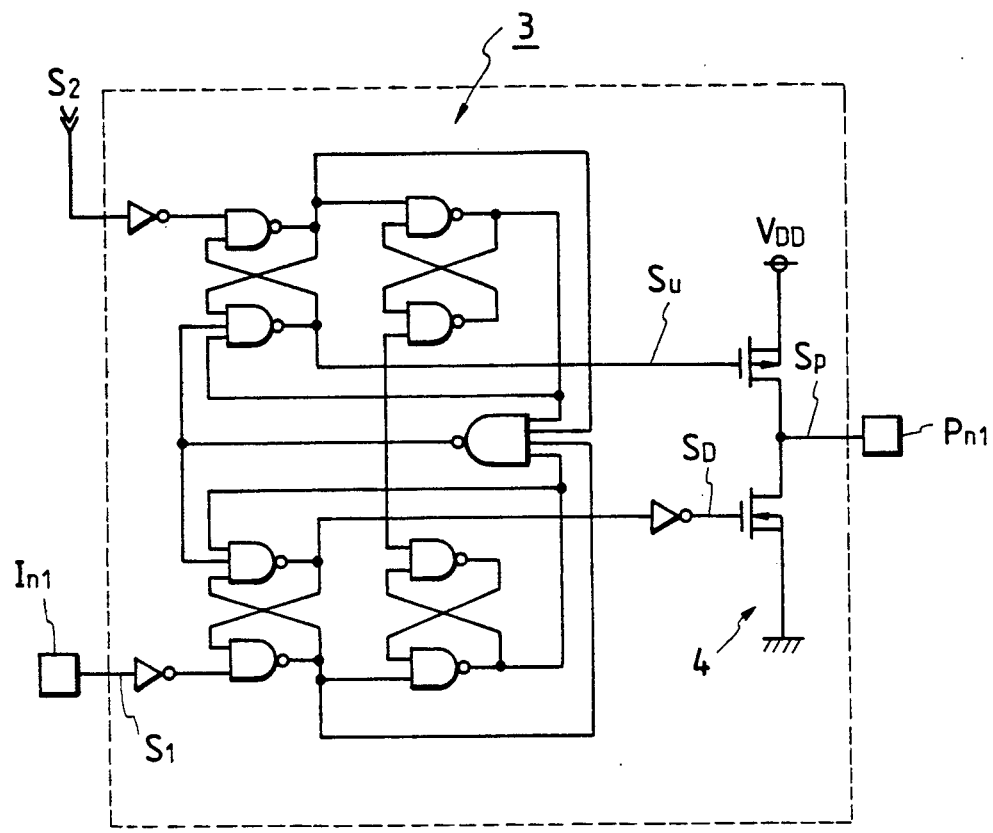
FIG. 2 is a circuit diagram showing an example of detailed construction of the phase comparison circuit.
Figure 3:
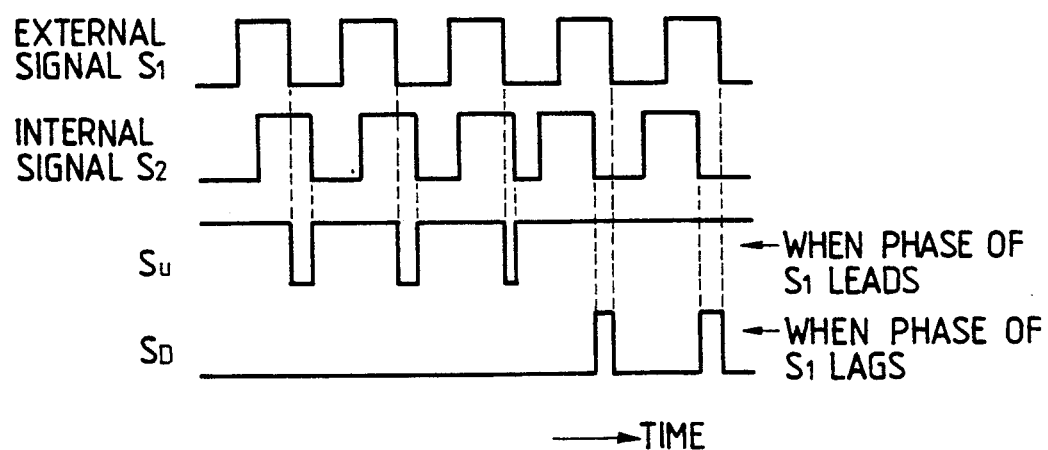
FIG. 3 is a waveform view showing the operation of the phase comparison circuit depicted in FIG. 2.

FIG. 2 is a diagram showing an example of the detailed construction of the phase comparison circuit 3 and the charge pump circuit 4. Specifically, the phase comparison circuit 3 is constituted by a digital phase comparator composed of NAND gates and inverter gates. As shown in FIG. 3, the phase comparison circuit 3 generates logical output signals $S_U$ and $S_D$ having a time width corresponding to the phase difference at the leading edge of the internal signal $S_2$ with respect to the given external signal $S_1$. More specifically, when the phase of the external signal $S_1$ leads the phase of the internal signal $S_2$, the level of the logical output signal $S_U$ becomes low, and when the phase of the external signal $S_1$ lags the phase of the internal signal $S_2$, the level of the logical output signal $S_D$ becomes high.

Further shown in FIG. 2, the charge pump circuit 4 is composed of a P-channel MOS transistor and an N-channel MOS transistor which are connected between an electric source contact $V_{DD}$ and a ground contact. The logical output signal $S_U$ is supplied to the gate contact of the P-channel MOS transistor. The logical output signal $S_D$ is supplied to the gate contact of the N-channel MOS transistor. The common node contact between the transistors is connected to the output terminal $Pn_1$. Accordingly, when both the levels of the logical output signals $S_U$ and $S_D$ are low, a high-level output signal $S_P$ is generated. When both the levels of the logical output signals $S_U$ and $S_D$ are high, a low-level output signal $S_P$ is generated. In the other conditions except for a transition, the output terminal $Pn_1$ is turned to a high-impedance state.

Figure 4:
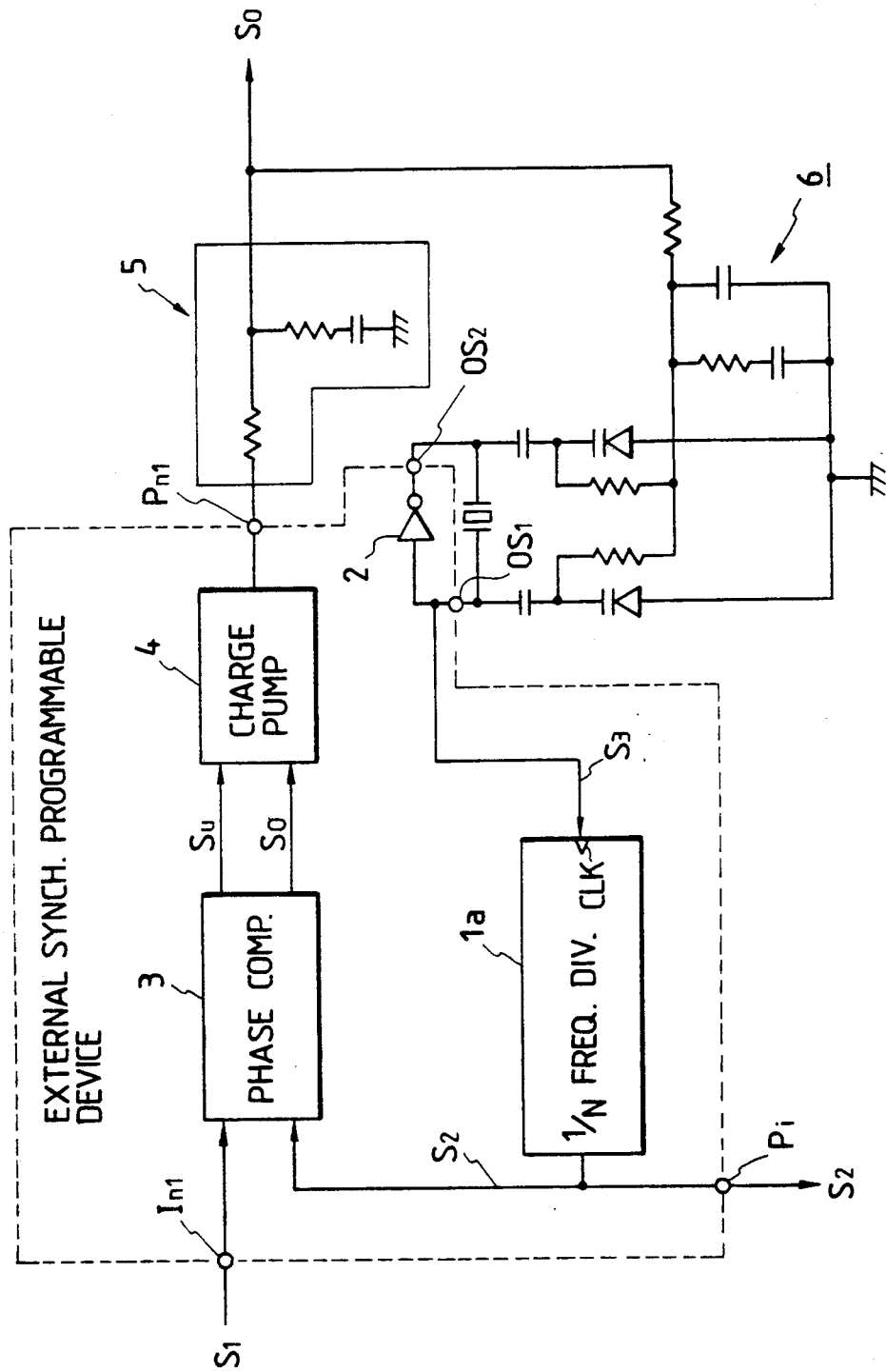
FIG. 4 is a circuit diagram in the case where the embodiment is applied to a PLL circuit.

FIG. 4 represents a circuit diagram where the external synchronization programmable device having the aforementioned construction is applied to a PLL circuit. Specifically, the portion surrounded by the broken line in FIG. 4 shows the external synchronization programmable device according to this embodiment. The 1/N frequency divider circuit 1a is realized by programming the lattice points of the AND matrix 1 (refer to FIG. 1). Circuits arranged outside the device are as follows. As shown in the drawing, a low-pass filter (lag/lead filter) 5 composed of a resistor and a capacitor is connected to the output terminal $Pn_1$. Further, a voltage-controlled oscillator circuit 6 including the amplifier 2 is formed by connecting a quartz resonator, variable-capacitance diodes, resistors, capacitors and the like between the input-output terminals $OS_1$ and $OS_2$. The output signal $S_o$ of the low-pass filter 5 is connected to the input terminal of the voltage-controlled oscillator circuit 6.

In the PLL circuit having the aforementioned construction, the voltage-controlled oscillator circuit 6 generates a signal $S_3$ of an oscillation frequency $f_2$ corresponding to the voltage of the signal $S_o$ given through the low-pass filter 5, so that the 1/N frequency divider circuit 1a divides the frequency of the signal $S_3$ by N to generate an internal signal $S_2$. The phase comparison circuit 3 detects the phase difference between the external signal $S_1$ and the internal signal $S_2$, so that a signal corresponding to the phase difference is sent out from the charge pump circuit 4 and then a signal $S_o$ integrated by the low-pass filter 5 is sent out.

By automatically repeating the aforementioned feedback control in the PLL circuit, the phase difference between the external signal $S_1$ and the internal signal $S_2$ is kept at zero to achieve external synchronization with respect to the external signal $S_1$.

In this embodiment, the 1/N frequency divider circuit 1a having a frequency division rate N corresponding to the program can be provided by programming the lattice points of the AND matrix 1 (refer to FIG. 1). Accordingly, the frequency of the signal $S_2$ applied to the phase comparison circuit 3 can be easily determined, providing a wide range of usage. Consequently, the degree of freedom in designing circuits is greatly improved.

In contrast, according to conventional PLL device designs (in the form of an IC), the frequency divider circuit is constituted by binary counters having a fixed number of bits or the like. Specifically, the conventional PLL device is constructed so that various kinds of frequency divider circuits can be realized by selecting the bit number, and therefore the count number (frequency division rate) used in the binary counters through a plurality of input terminals, although the number of designation of the frequency division rate is restricted. Accordingly, the conventional PLL device is functionally restricted even though it is provided as an IC because it requires a large number of terminals arranged in the outside thereof or because the frequency division rate has an upper limit. However, in this embodiment, the frequency divider circuit and other circuits can be realized and easily changed by programming the lattice points of the AND matrix 1 (refer to FIG. 1). Accordingly, the external designation of the counter value which is necessary for the conventional device is unnecessary for the device of the invention. Further, limitations in the number of designation of the frequency division rate in the frequency divider circuit can be improved greatly. Consequently, a device with a wide range of uses and which has an improved degree of freedom in circuit design in comparison with the conventional device is provided.

Figure 5:
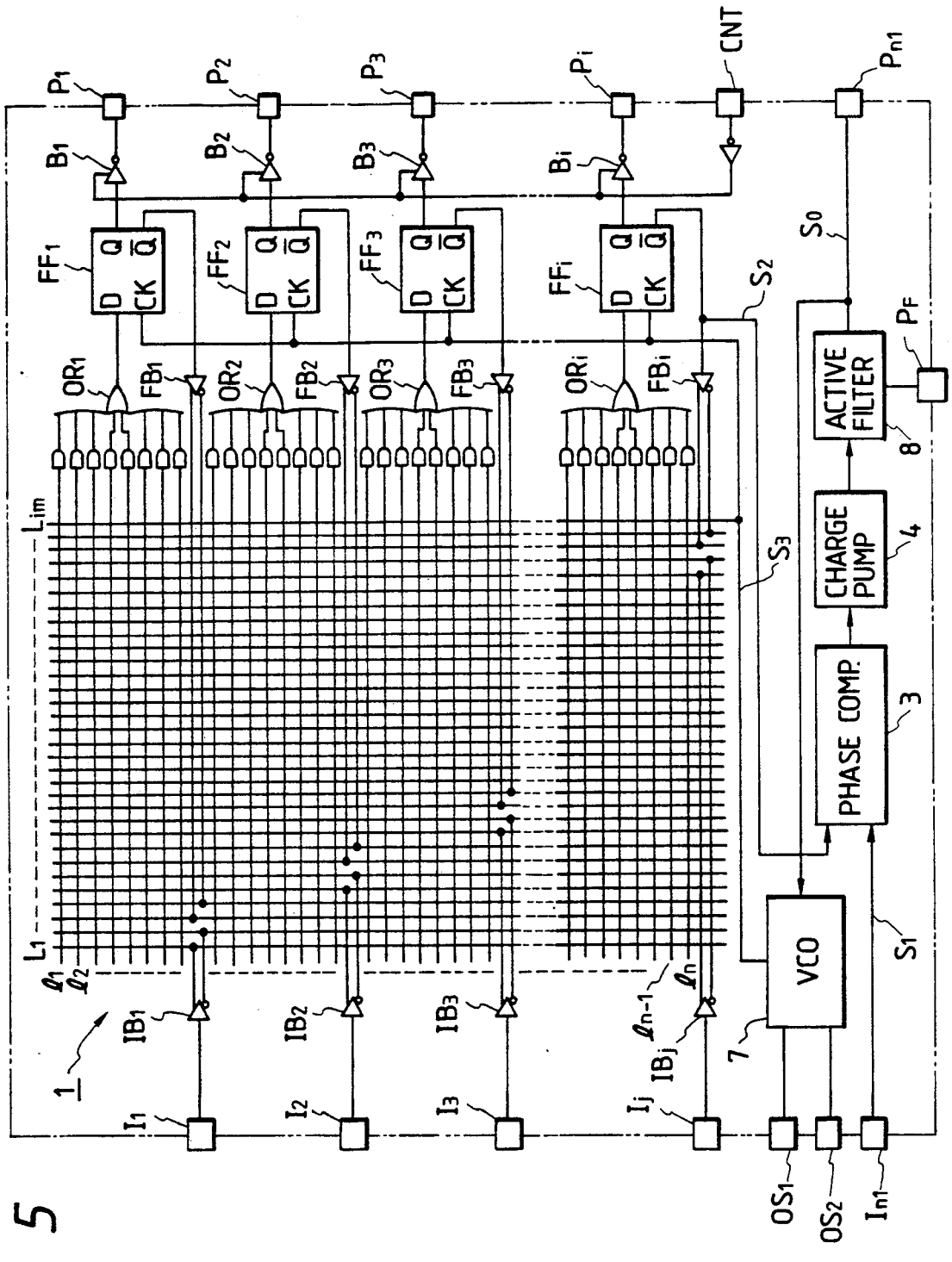
FIG. 5 is an explanatory diagram showing an example of the configuration of another embodiment of the present invention.

Another embodiment of the invention is will be described below with reference to FIG. 5. The embodiment is different from the preceding embodiment of FIG. 1 in that the whole device of FIG. 5 is formed as an IC. This device includes an AND matrix 1 and an OR matrix to realize a desired logic circuit by programming lattice points provided in the intersections of input signal lines $L_1$-$L_m$ and AND term lines $l_1$-$l_n$ a preliminarily fixed phase comparison circuit 3, a charge pump circuit 4, a voltage-controlled oscillator circuit 7, and an active filter 8.

The phase comparison circuit 3 and the charge pump circuit 4 have the same construction as shown in FIG. 2. The phase comparison circuit 3 is arranged so that the external signal $S_1$ is supplied from the input terminal $In_1$ and the internal signal $S_2$ is supplied from the programmable matrix portion in the same manner as in the preceding embodiment.

Figure 6:
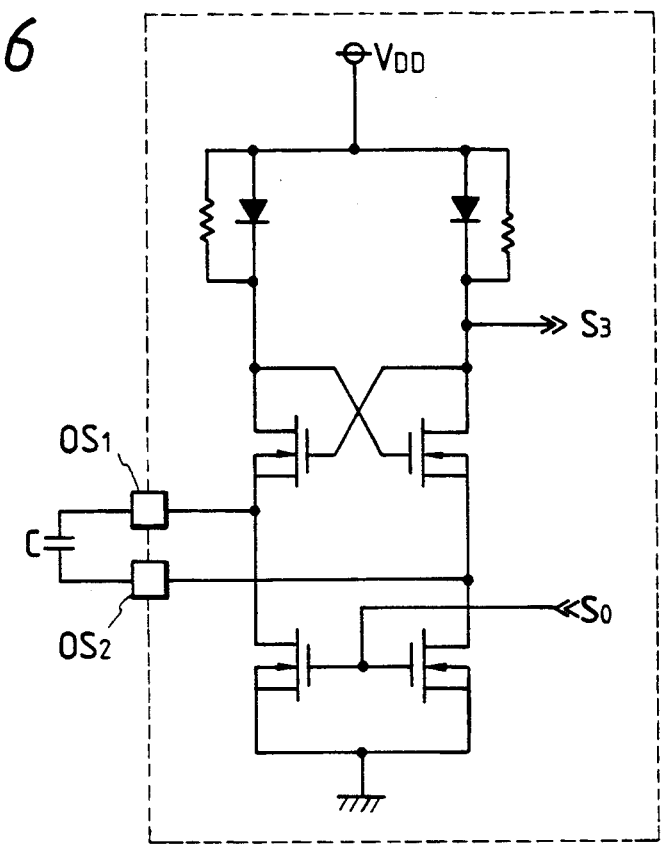
FIG. 6 is a circuit diagram showing an example of detailed construction of the voltage-controlled oscillator circuit in the other embodiment.

For example, the voltage-controlled oscillator circuit 7 is surrounded by the broken line in FIG. 6. Specifically, the circuit 7 is composed of CMOS transistors, diodes and resistors. The circuit 7 can generate a signal $S_3$ of a predetermined frequency corresponding to the voltage level of the signal $S_o$ by connecting a capacitor C having a suitable value of capacitance between the input-output terminals $OS_1$ and $OS_2$. The signal $S_o$ is the output of the active filter 8. The signal $S_3$ is supplied to the clock-input terminals of the AND matrix 1.

Figure 7:
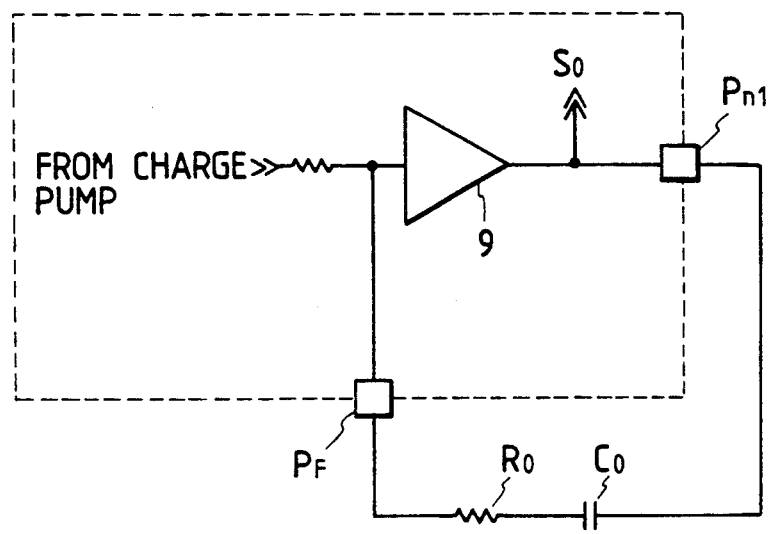
FIG. 7 is a circuit diagram showing an example of detailed construction of the active filter in the other embodiment.
Figure 8:
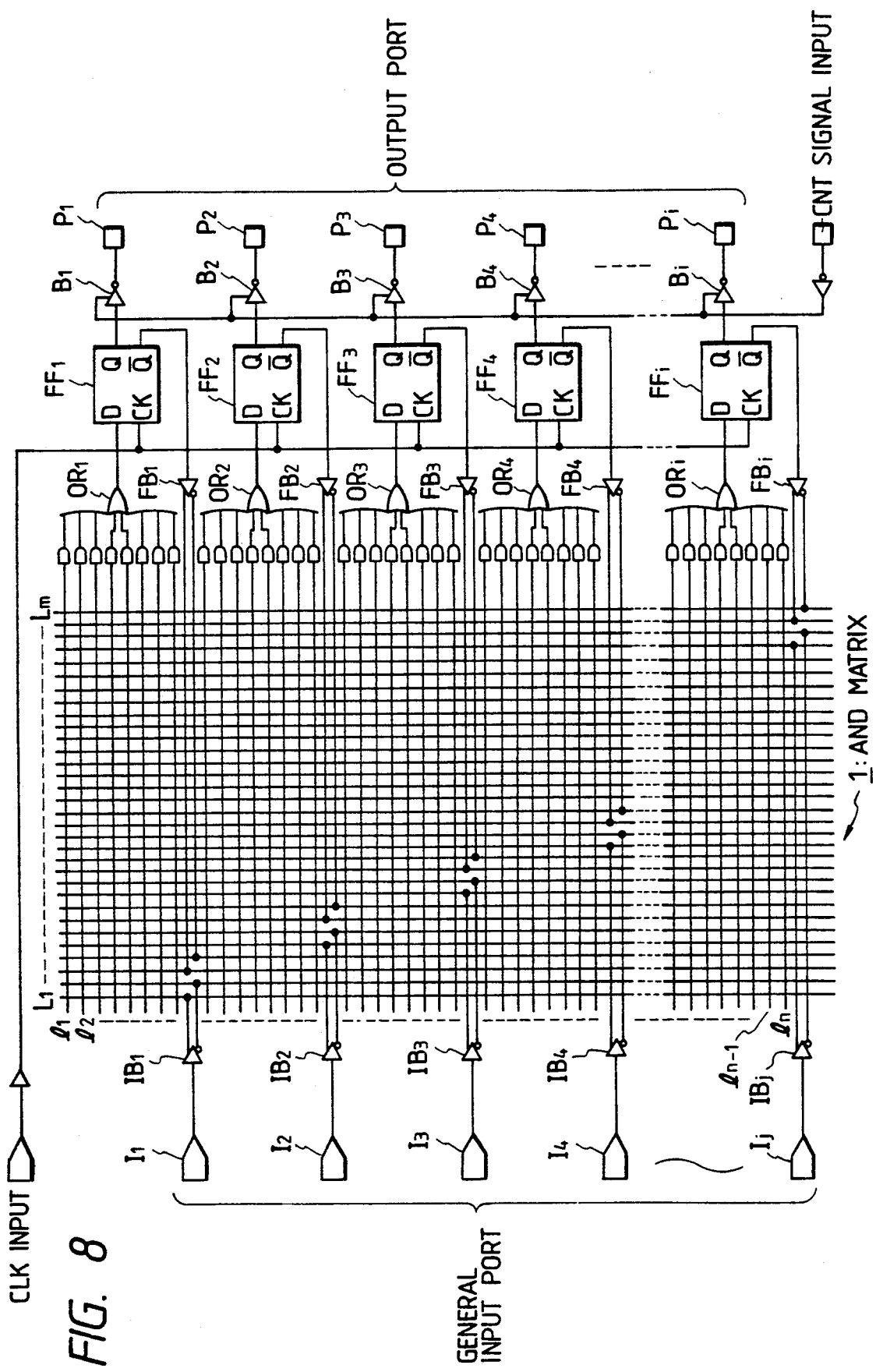
FIG. 8 is an explanatory diagram showing an example of the configuration of a conventional programmable logic device.

For example, the active filter 8 is composed of an amplifier 9 and a resistor, as surrounded by the broken line in FIG. 7. A low-pass filter having a desired frequency characteristic can be realized by externally connecting a resistor $R_o$ and a capacitor $C_o$ between a terminal $P_F$ connected to the input contact of the amplifier 9 and the output terminal $Pn_1$.

A PLL circuit can be easily constructed because a frequency divider circuit, having a desired frequency division rate, can be designed by programmably connecting certain lattice points of the AND matrix 1.

In this embodiment, the device includes the basic parts of the phase comparison circuit, charge pump circuit, active filter and voltage-controlled oscillator circuit. Accordingly, the number of parts provided on the outside can be reduced at the time of assembling the PLL circuit.

Not only can another logic circuit be formed through the AND circuit 1, but also a PLL circuit having another characteristic can be realized by changing the program. Accordingly, the degree of freedom in circuit design is greatly improved.

Although the aforementioned two embodiments employ a CMOS process for production of the device, a Bi-CMOS process may also be used for internally constructing a circuit such as a phase comparison circuit capable of performing analog signal processing.

Figure 9:
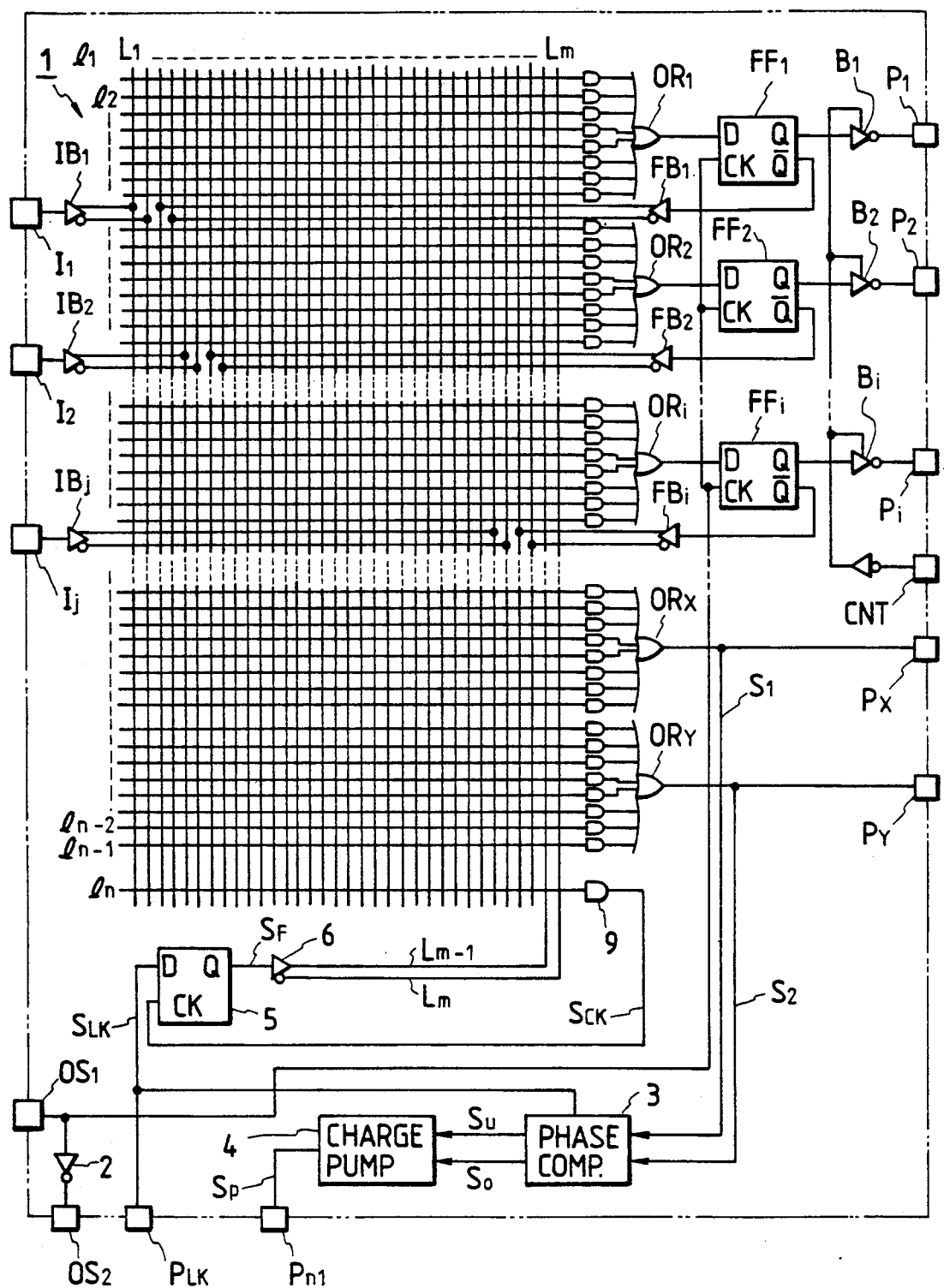
FIG. 9 is an explanatory diagram showing an example of the configuration of an embodiment of the present invention.

Further, FIG. 9 is a diagram showing another example of the configuration of an embodiment of the present invention. The same reference numerals shown in FIG. 1 designate the same or corresponding elements in FIG. 9. In FIG. 9, reference numeral 2 designates an amplifier connected between input-output terminals $OS_1$ and $OS_2$. The input contact of the amplifier 2 is connected to the clock-input terminals (CK) of internal flip-flop circuits.

Reference numeral 3 designates a phase comparison circuit which compares the phase of a first signal $S_1$ as an OR matrix output $OR_X$ with the phase of a second signal $S_2$ as an OR matrix output $OR_Y$ and generates logical signals $S_U$ and $S_D$ expressing the phase difference between the two signals. A logical signal $S_{LK}$ is also generated which expresses whether the phases of the two signals coincide with each other.

Reference numeral 4 designates a charge pump circuit in which a digital signal SP subjected to pulse-width modulation, which is responsive to the logical signals $S_U$ and $S_D$ generated from the phase comparison circuit 3, is fed to an output terminal $Pn_1$.

Figure 10:
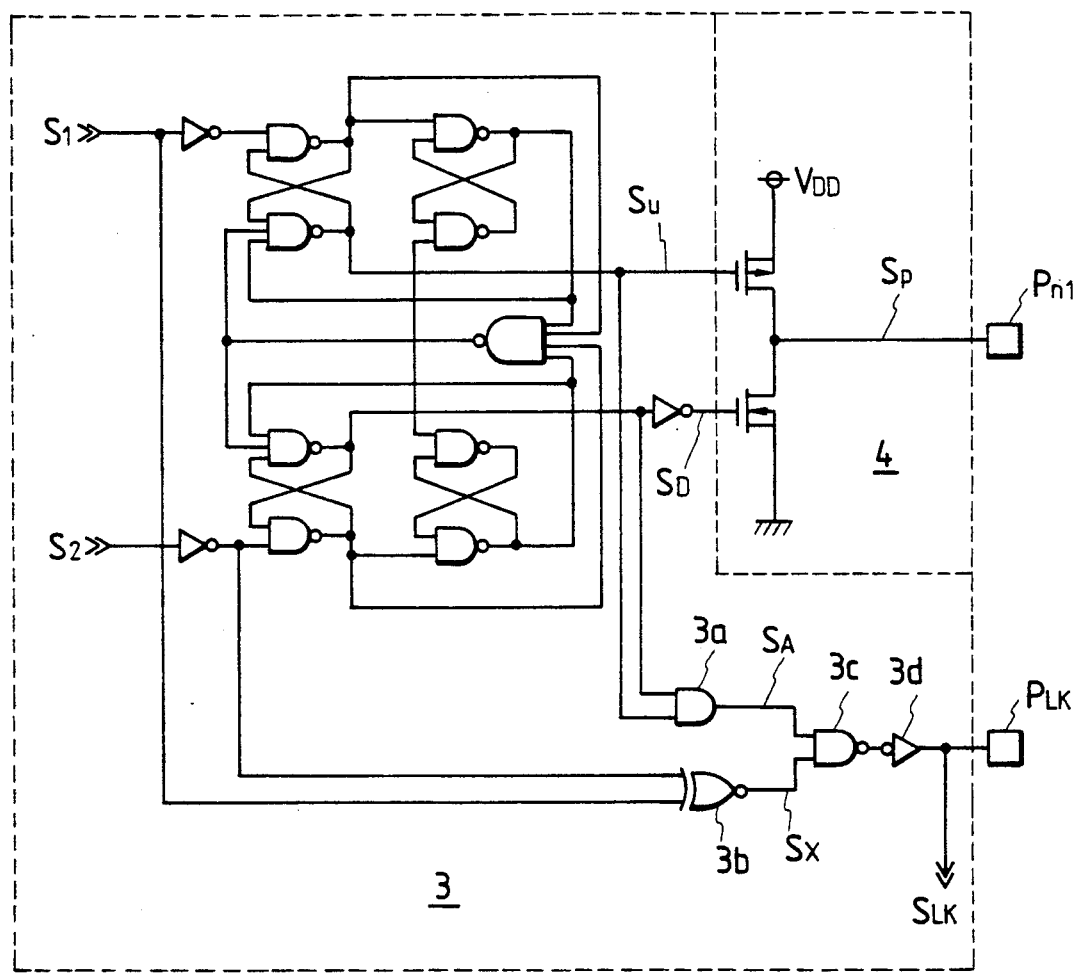
FIG. 10 is a circuit diagram showing an example of detailed construction of the phase comparison circuit.

FIG. 10 represents an example of a detailed construction of the phase comparison circuit 3 and the charge pump circuit 4. Specifically, the phase comparison circuit 3 is constituted by a digital phase comparator composed of NAND gates, AND gates, inverter gates and exclusive NOR gates. The phase comparison circuit 3 generates logical output signals $S_U$ and $S_D$ having a time width corresponding to the phase difference at the leading edge of the signal $S_2$ with respect to the given signal $S_1$. Specifically, when the phase of the signal $S_1$ leads the phase of the signal $S_2$, the level of the logical output signal $S_D$ becomes high. On the other hand, when the phase of the signal $S_1$ lags the phase of the signal $S_2$, the level of the logical output signal $S_U$ becomes low.

Further, a circuit composed of an AND gate 3a, an exclusive OR gate 3b, an NAND gate 3c and an inverter gate 3d generates a logical signal $S_{LK}$ whose level becomes high when the phases of the signals $S_1$ and $S_2$ coincide with each other and becomes low when the logical levels of the signals $S_1$ and $S_2$ are different from each other. The logical signal $S_{LK}$ is sent out through an output terminal $P_{LX}$.

On the other hand, as shown in FIG. 2, the charge pump circuit 4 is composed of a P-channel MOS transistor and an N-channel MOS transistor which are connected between an electric source contact $V_{DD}$ and a ground contact. The logical output signal $S_U$ is supplied to the gate contact of the P-channel MOS transistor. The logical output signal $S_D$ is supplied to the gate contact of the N-channel MOS transistor. The common node contact between the transistors is connected to the output terminal $Pn_1$. Accordingly, when both the levels of the logical output signals $S_U$ and $S_D$ are low, a high-level output signal $S_P$ is generated. When both the levels of the logical output signals $S_U$ and $S_D$ are high, a low-level output signal $S_P$ is generated. In the other conditions, the output terminal $Pn_1$ is turned to a high-impedance state (except not a transition state).

Further, in FIG. 9 reference numeral 5 designates a D-type flip-flop circuit. The logical signal $S_{LK}$ from the phase comparison circuit 3 is supplied to the data-input contact D of the flip-flop circuit. An output signal from the output contact Q of the flip-flop circuit is supplied to input signal lines $L_{m-1}$ and $L_{m-2}$ of the AND matrix 1. Further, a signal $S_{CK}$ from a predetermined output terminal (functionally represented by the AND gate 9) of the AND matrix 1 is supplied to the clock-input terminal (CK) of the flip-flop circuit.

Figure 11:
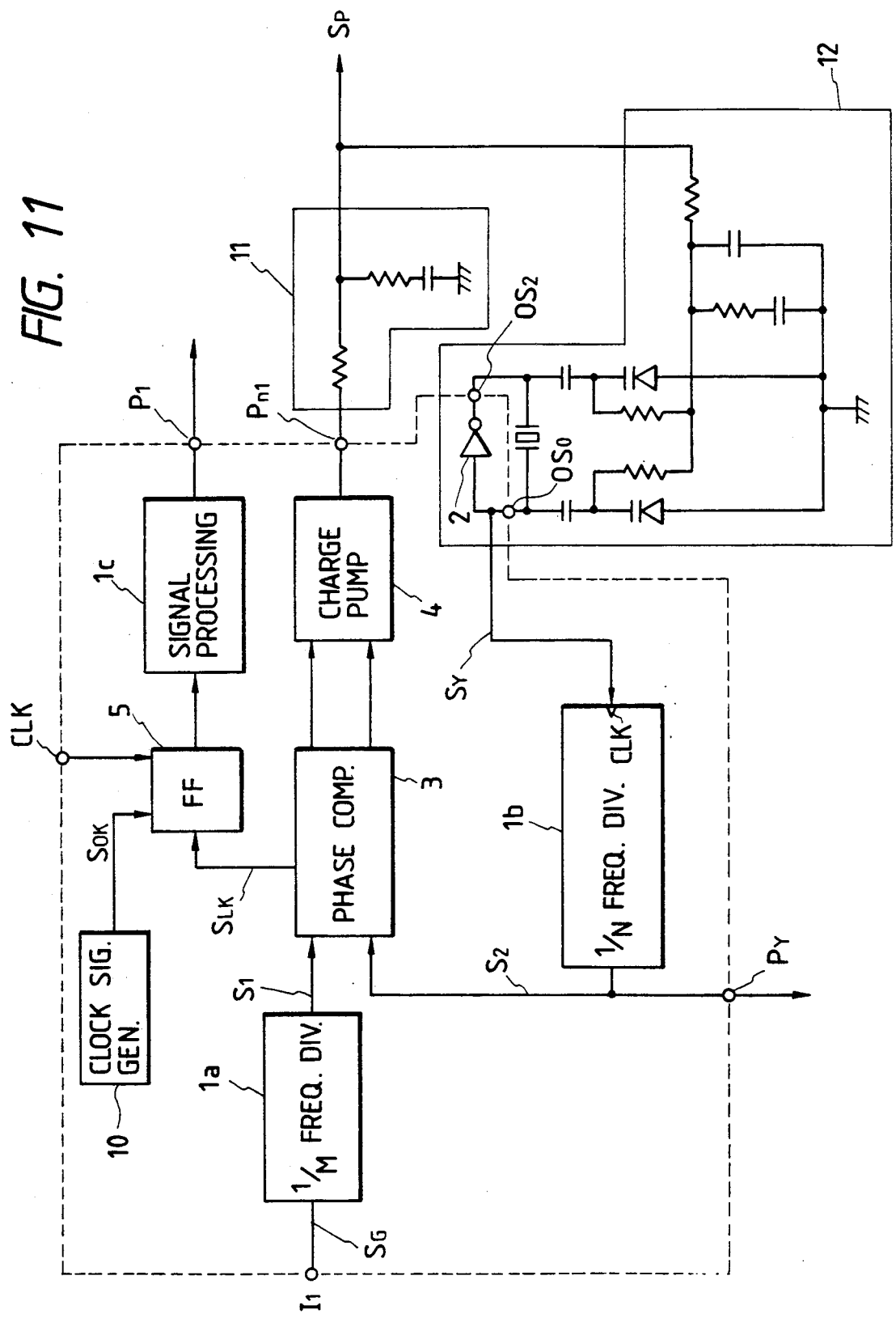
FIG. 11 is a circuit diagram in the case where the device in this embodiment is applied to a PLL circuit.

FIG. 11 represents a circuit diagram where the external synchronization programmable device having the aforementioned construction is applied to a PLL circuit. Specifically, the portion surrounded by the broken line in FIG. 11 shows the external synchronization programmable device related to this embodiment. A 1/M frequency divider circuit 1a, a 1/N frequency divider circuit 1b, and a signal processing circuit 1c are realized by suitably programming lattice points of the AND matrix 1 (Refer to FIG. 9).

The 1/M frequency divider circuit 1a, for example, supplied with an external signal $S_G$ through an input terminal $I_1$, can be realized by programming lattice points of the AND matrix to generate a signal $S_1$ of a 1/M frequency in a predetermined output terminal $OR_X$ of the OR matrix by dividing the frequency of the external signal $S_G$ by M.

The 1/N frequency divider circuit 1b can be realized by programming lattice points of the AND matrix to generate a signal $S_2$ of a 1/N frequency in a predetermined output terminal $OR_Y$ of the OR matrix by dividing the frequency of the signal $S_Y$ on the input signal line $L_m$ by N.

The signal processing circuit 1c is a circuit providing various kinds of control signals by transferring the output signal $S_{LK}$ of the phase comparison circuit 3 to the input signal lines $L_{m-1}$ and $L_{m-2}$ through the flip-flop circuit 5. The signal processing circuit 1c is realized by programming suitable lattice points between the input signal lines $L_{m-1}$ and $L_{m-2}$ and the OR matrix.

Further, the clock signal generating circuit 10 is formed by programming lattice points of the AND matrix 1 to generate a signal $S_{CK}$ on a predetermined output terminal of the AND matrix as represented by the AND gate 9 in FIG. 9.

Circuits arranged outside of the device are as follows. As shown in FIG. 11, a low-pass filter (lag/lead filter) 11 composed of a resistor and a capacitor is connected to the output terminal $Pn_1$. Further, a voltage-controlled oscillator circuit 12 including the amplifier 2 is formed by connecting a quartz resonator, variable-capacitance diodes, resistors, capacitors and the like between the input-output terminals $OS_1$ and $OS_2$. The output signal $S_P$ of the low-pass filter 11 is connected to the input contact of the voltage-controlled oscillator circuit 12.

In the PLL circuit having the aforementioned construction, the voltage-controlled oscillator circuit 12 generates a signal $S_Y$ of an oscillation frequency corresponding to the voltage of the signal $S_P$ given through the low-pass filter 11, so that the 1/N frequency divider circuit 1b divides the frequency of the signal $S_Y$ by N to thereby generate a signal $S_2$. Further, the 1/M frequency divider circuit 1a divides the frequency of the signal $S_G$ by M so as to generate a signal $S_1$. The phase comparison circuit 3 detects the phase difference between the signal $S_1$ and the internal signal $S_2$, so that a signal corresponding to the phase difference is sent out from the charge pump circuit 4. Then, a signal $S_P$ integrated by the low-pass filter 11 is sent out.

External synchronization with respect to the external signal $S_G$ to make the phase difference between the signal $S_1$ and the internal signal $S_2$ zero is realized by automatically repeating the aforementioned feedback control in the PLL circuit.

FIG. 12 shows waveforms of signals at respective contacts where the phase of the signal $S_1$: lags the phase of the signal $S_2$, leads the phase of the signal $S_2$, and coincides with $S_2$ (the phases are locked). The purpose of these waveforms is to explain the operation of the phase comparison circuit in FIG. 10 and the operation of the PLL circuit in FIG. 11.

In the case the phases of the signals $S_1$ and $S_2$ coincide, (represented by the period after the time 1200), whisker-like pulses are produced in the output signal $S_A$ of the AND gate 3a (Refer to FIG. 10) in the phase comparison circuit 3. These pulses are not produced in the output signal $S_X$ of the exclusive OR gate 3b. Whisker-like pulses are produced in the logical signal $S_{LK}$ generated in the phase comparison circuit 3. If the logical signal $S_{LK}$, including the whisker-like pulses, is directly supplied to the signal processing circuit 1c to perform signal processing through the AND matrix, normal signal processing cannot be performed. However, in this embodiment, the flip-flop circuit 5, for removing these unnecessary whisker-like pulses, is internally provided to feed the logical signal $S_{LK}$ back to the AND matrix through the flip-flop circuit 5. Consequently, normal signal processing can be performed.

As described above, in this embodiment, any circuit corresponding to the program can be formed by programming suitable lattice points of the AND matrix (refer to FIG. 9). Further, the phase comparison circuit, which supplies the AND matrix with a logical signal expressing whether the phases of the two signals coincide with each other, can be internally provided in advance. Accordingly, this embodiment is very useful for realizing an external synchronization system. Not only can the range of application of the circuit be widened, but also the degree of freedom in circuit design can be greatly improved.

Although the aforementioned embodiments have shown the case where a CMOS process is used for production of the device, a Bi-CMOS process may also be used for internally forming a circuit such as a phase comparison circuit capable of performing analog signal processing.

As described above, the device according to the present invention is provided therein with at least a programmable logic portion having an AND matrix and an OR matrix for realizing a desired logic circuit by programmable connection and a phase comparison circuit having outputs connected to predetermined signal input lines of the AND matrix and for comparing the phase of an external signal with the phase of an internal signal generated in the logic circuit to thereby generate a signal expressing phase lagging or phase leading. Accordingly, an external synchronization system for feeding the signal expressing the phase difference between the external signal and the internal signal back to the internal circuit to make the signal reach to a predetermined value can be attained easily by a small number of parts. Further, a suitable circuit can be realized in the programmable logic portion having the AND matrix by suitably programming lattice points thereof. Accordingly, the degree of freedom in circuit design is high and the design can be easily changed.

In particular, the invention can provide a very effective means for forming a PLL circuit.

As described above, according to the present invention, signals respectively expressing phase leading, phase lagging and phase coincidence (or frequency leading, frequency lagging and frequency coincidence) between the externally supplied signal and an internal signal generated in an internal circuit formed in the internal programmable logic portion can be generated by supplying the external and internal signals to the phase comparison circuit. Accordingly, an external synchronizing system, such as a PLL circuit, for feeding the respective signal back to a voltage-controlled oscillator circuit to make the signal reach a predetermined value can be easily realized by a small number of parts.

Further, any suitable control circuit for controlling various kinds of devices according to the signal expressing whether the phases of the two signals coincide with each other can be realized by use of the programmable logic portion. Accordingly, a complex externally synchronizing system can be easily realized by a small number of parts.

In addition, any desired circuit can be realized in the programmable logic portion by programming suitable lattice points. Accordingly, the degree of freedom in circuit design can be made high and the design can be easily changed.

What is claimed is:

1. An external synchronization programmable device comprising: a programmable logic portion having an AND matrix and an OR matrix for implementing a desired logic circuit by programming connections, said logic portion being programmed to generate an internal signal having a phase and a leading edge; means for supplying an external signal having a phase; and a phase comparison circuit for comparing the phase of said external signal with the phase of said internal signal, wherein said phase comparison circuit generates a signal expressing phase lagging and phase leading.

2. An external synchronization programmable device comprising: a programmable logic portion having an AND matrix and an OR matrix for implementing a desired logic circuit by programming connections, said AND matrix having input signal lines, said logic portion being programmed to generate an internal signal having a phase; means for supplying an external signal having a phase; and a phase comparison circuit for comparing the phase of said external signal with the phase of said internal signal, wherein said phase comparison circuit generates a signal representative of the phase difference between the two signals and supplies a signal expressing whether the phases of said external signal and said internal signal coincide with each other to feed the signal to a predetermined part of said input signal lines of said AND matrix.

3. An external synchronization programmable device according to claim 1, wherein said phase comparison circuit further comprises: a digital phase comparator circuit comprising a plurality of NAND circuits and a plurality of inverter circuits, said circuits arranged so that said phase comparison circuit generates a first logical output signal and a second logical output signal, said output signals being representative of the time width corresponding to the phase difference at the leading edge of said internal signal with respect to said external signal.

4. The external synchronization programmable device according to claim 3, further comprising a pump circuit comprising: a P-channel MOS transistor; and an N-channel MOS transistor, wherein said pump circuit is responsive to said logical output signals of said phase comparison circuit and generating a high output when both of said output signals are low, a low output when both of said output signals are high, and a high-impedance level when said first and said second output signals are different.

5. The external synchronization programmable device according to claim 3, wherein said first output signal is low when said phase of said external signal leads said phase of said internal signal; and said second output signal is high when said phase of said external signal lags said phase of said internal signal.

6. The external synchronization programmable device according to claim 4, further comprising: a phase-locked loop circuit located outside of said programmable device, said phase-locked loop circuit comprising: a low-pass filter outputting a voltage signal responsive to output of said pump circuit, and a voltage-controlled oscillator circuit responsive to said output of said low-pass filter, wherein said voltage-controlled circuit generates a signal having an oscillation frequency corresponding to the voltage of said output of said low-pass filter.

7. An external synchronization programmable device connected to an external signal having a phase, comprising: an AND matrix; an OR matrix, wherein said AND matrix and said OR matrix can be programmed to form a logic circuit generating at least an internal signal having a phase; a fixed phase comparison circuit for comparing the phase of said internal signal and said external signal; a charge pump circuit for generating an output indicative of the difference between said phases of said internal signal and said external signal; a voltage-controlled oscillator circuit; an active filter responsive to said charge pump circuit and generating an output to control said voltage-controlled oscillator circuit; wherein, said voltage-controlled oscillator circuit generates a signal having a predetermined frequency corresponding to said output of said active filter to synchronize operation of said programmable logic circuit with said external signal.

8. The external synchronization programmable device according to claim 7, wherein said active filter further comprises: an amplifier; and a resistor having a predetermined frequency characteristic.

9. An external synchronization programmable device comprising: a programmable logic portion having an AND matrix and an OR matrix for designing a desired logic circuit by programming connections, said OR matrix having at least a first and second output with a unique phase; and a phase comparison circuit for comparing the phase of said first output with the phase of said second output, wherein said phase comparison circuit generates a signal expressing phase lagging and phase leading.

10. The externally synchronized programmable device according to claim 9, wherein said phase comparison circuit further comprises: a plurality of NAND circuits; a plurality of AND circuits; a plurality of inverter circuits; and a plurality of exclusive NOR circuits; wherein said circuits are arranged to generate first and second logical output signals representative of the time width corresponding to the phase difference of said leading edge of said second signal of said OR matrix with respect to the phase of said first signal of said OR matrix.

* * * * *